(12) United States Patent
Palinkas et al.

(10) Patent No.: US 8,150,004 B2
(45) Date of Patent: Apr. 3, 2012

(54) LOW-PASS STEP ATTENUATOR

(75) Inventors: Ray Palinkas, Canastota, NY (US); Ahmet Burak Olcen, Syracuse, NY (US); Tom Hart, Canastota, NY (US)

(73) Assignee: John Mezzalingua Associates, Inc., East Syracuse, NY (US)

( * ) Notice: Subject to any disclaimer, the term of this patent is extended or adjusted under 35 U.S.C. 154(b) by 1497 days.

(21) Appl. No.: 11/616,524

(22) Filed: Dec. 27, 2006

(65) Prior Publication Data
US 2008/0157898 A1  Jul. 3, 2008

(51) Int. Cl.
*H04M 11/00* (2006.01)
(52) U.S. Cl. ............. 379/90.01; 379/93.05; 379/93.08; 725/127
(58) Field of Classification Search ........... 379/90.01, 379/93.08, 93.05, 93.06, 93.28; 725/127, 725/128, 129; 370/419
See application file for complete search history.

(56) References Cited

U.S. PATENT DOCUMENTS

| 5,390,337 A | 2/1995 | Jelinek et al. |
| 5,745,838 A | 4/1998 | Tresness et al. |
| 5,959,507 A | 9/1999 | Gresko |
| 6,784,760 B2 | 8/2004 | Olcen et al. |
| 6,879,816 B2 | 4/2005 | Bult et al. |
| 2003/0151695 A1* | 8/2003 | Sahlin et al. ............. 348/705 |
| 2004/0085156 A1* | 5/2004 | Olcen et al. ............. 333/176 |

OTHER PUBLICATIONS

The International Search Report for PCT Application No. PCT/US2007/083721; Filed Nov. 6, 2007; Date of Completion Apr. 9, 2008; Date of Mailing May 16, 2008.
The Written Opinion for PCT Application No. PCT/US2007/083721; Filed Nov. 6, 2007; Date of Completion Apr. 9, 2008; Date of Mailing May 16, 2008.

* cited by examiner

*Primary Examiner* — Stella Woo
(74) *Attorney, Agent, or Firm* — Schmeiser Olsen & Watts (57) ABSTRACT

A filter circuit is constructed as a triplex filter having a high-pass filter, a low-pass filter with attenuation in the passband, and a second low-pass filter without attenuation in the passband. The filter circuit has a frequency response with a high-pass portion, a flat loss portion, and a low-pass portion. Attenuation in the flat loss portion is uniform and is predetermined via selection of filter components. The filter circuit is useful in a bidirectional CATV system in which performance is improved by selectable attenuation of a first source of return path signals but without attenuation of a second source of return path signals.

28 Claims, 6 Drawing Sheets

LOW-PASS STEP ATTENUATOR

BACKGROUND OF THE INVENTION

Many communications systems allocate separate frequency bands for signals from different sources. One such example is a bidirectional cable ("CATV") system with a forward path from a head end to one or more subscribers and a return path from the subscribers to the head end. Signals on the forward path may include broadcast television channels. Signals on the return path may include data from a subscriber's cable modem. It is common for signals on the forward path of a CATV system to be transmitted in one frequency band and for signals on the return path to be transmitted in a second frequency band which is lower than and does not overlap with the first frequency band.

CATV systems are commonly designed to provide proper signal levels on the forward path at each subscriber tap. In a bidirectional CATV system, insertion loss in the return path may differ widely among taps. Performance of bidirectional systems can be significantly improved by appropriate attenuation of the return path signals. The attenuation reduces ingress noise and improves the signal to noise ratio of the cable modem. In particular, performance may improve if selective attenuation levels can be applied at various points of the return path.

CATV systems may have more than one source of return path signals, each source transmitting in a different frequency range. In one common example, a subscriber has both a cable modem and a set top box receiver for digital cable television service. The set top box may transmit information, for example, indicating that a subscriber wishes to purchase a video-on-demand program. The frequency band for signals from the set top box is typically lower than the frequency band for signals from the cable modem. The set top box may require less attenuation than the cable modem, so that applying the required amount of attenuation for return path signals from the cable modem would overattenuate the return path signals from the set top box.

A simple approach known in the prior art to provide attenuation to the return path is the use of a high-pass filter. A high-pass filter can attenuate the lower frequency return path signals but pass higher frequency forward path signals without attenuation. A high-pass filter is disadvantageous because outside of a transition range it provides either very large attenuation or no attenuation at all to a signal at a particular frequency. Better performance will be achieved if attenuation levels can be selected precisely at each tap. A high-pass filter also cannot provide uniform attenuation across a range of frequencies.

A more sophisticated approach, also known in the prior art, is the use of a step attenuator. A conventional step attenuator allows for selective attenuation in the return path via selection of frequency-dependent or frequency-independent components. Conventional step attenuators used in CATV systems achieve flat loss for the full return path. A conventional step attenuator, however, is not suitable for the situation in which two sources of return path signals requiring different levels of attenuation are present. For example, if a set top box transmits between 10-12 MHz and a cable modem transmits between 20 and 40 MHz, a conventional step attenuator cannot apply loss to signals from the cable modem without applying similar loss to signals from the set top box.

Yet another approach for attenuating return path signals is the use of a windowed filter. A windowed filter is a high-pass filter with a second passband. It is known in the art to design the high-pass filter to pass the forward path frequencies without attenuation and to design the passband to pass the return path frequencies without attenuation. By adding attenuation to the passband, for example through the use of a resistive network, the windowed filter can provide selective loss to the return path signals in the pass band. Yet a windowed filter suffers from at least the same difficulties as the full band step attenuator discussed above. The passband cannot apply different levels of uniform attenuation to different sources of return path signals, and the regions of the spectrum outside of the high-pass region and the passband region are of non-uniform attenuation. A prior art windowed filter thus cannot pass signals on the return path from a set top box without attenuation while simultaneously passing signals on the return path from a cable modem with uniform attenuation.

BRIEF SUMMARY OF THE INVENTION

The present invention addresses the above needs and achieves other advantages by providing a circuit that produces a frequency response having a low-pass portion with relatively little or no attenuation, a high-pass portion with relatively little or no attenuation, and a flat loss portion with relatively higher uniform attenuation.

In one embodiment of the invention, a filter circuit produces an insertion loss frequency response having predetermined flat loss within a predetermined frequency range.

A further embodiment of the present invention provides a filter circuit for a bidirectional communications systems such as a CATV system that passes forward path signals from a head end and return path signals from a set top box without attenuation and that passes return path signals from a cable modem with flat attenuation.

In accordance with one embodiment, a filter circuit maintains a return loss of 20 dB or more in all frequency bands used for signals in a bidirectional communications system.

The circuit apparatus in accordance with one embodiment uniformly attenuates signals across a predetermined frequency range. The circuit passes signals without attenuation in a high-pass region at frequencies higher than the predetermined frequency range. The circuit passes signals without attenuation in a low-pass region at frequencies lower than the predetermined frequency range. Accordingly, this circuit is suitable for use in a bidirectional CATV system in which return path signals from a cable modem require more attenuation than return path signals from a set top receiver.

In one embodiment, a circuit uniformly attenuates signals for all frequency bands where attenuation levels are different for each frequency band. There are at least three different frequency bands in such a design.

BRIEF DESCRIPTION OF THE SEVERAL VIEWS OF THE DRAWING(S)

Having thus described the invention in general terms, reference will now be made to the accompanying drawings, wherein:

DETAILED DESCRIPTION OF THE INVENTION

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Figure 1:
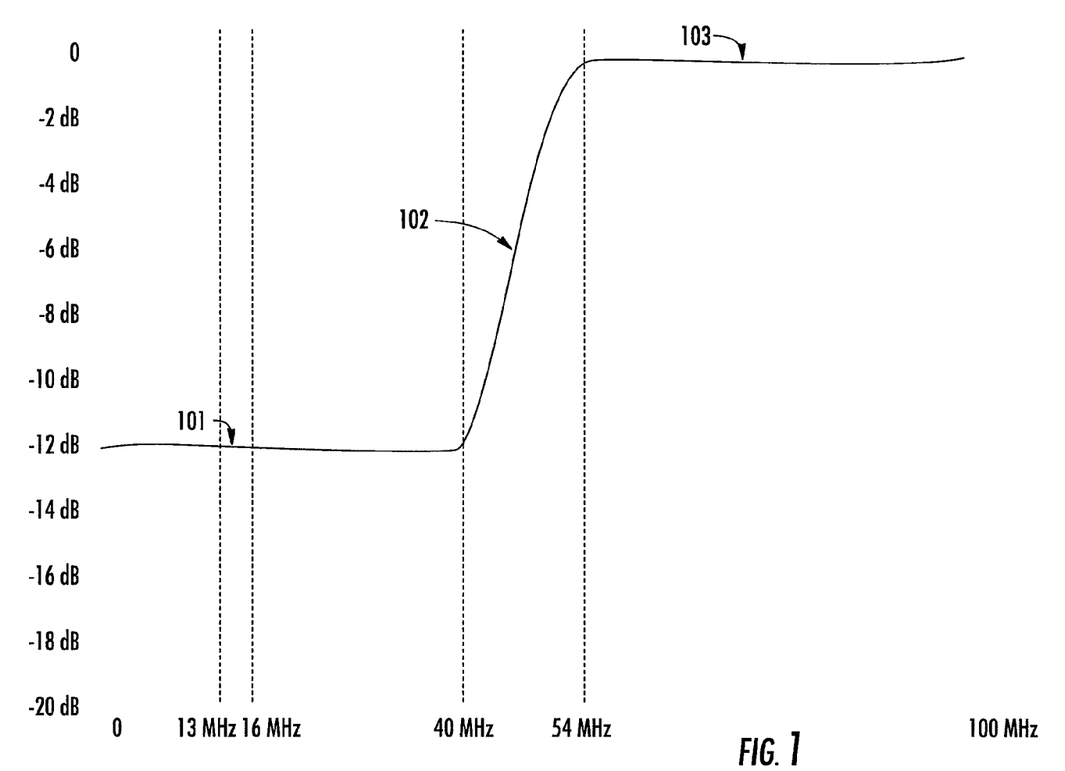
FIG. 1 is a diagram of the insertion loss of a prior art step attenuator as a function of frequency.

With reference to the drawings, in FIG. 1 there is shown a plot of insertion loss as a function of frequency in a prior art step attenuator. The vertical axis represents insertion loss in dB. The horizontal axis represents bandwidth from DC to 100 MHz. An attenuating portion of the bandwidth 101 shows flat attenuation of approximately 12 dB from DC to 40 MHz. A transition portion 102 exists from 40 MHz to 54 MHz. There is no attenuation in the high-pass portion 103 above 54 MHz.

Figure 2:
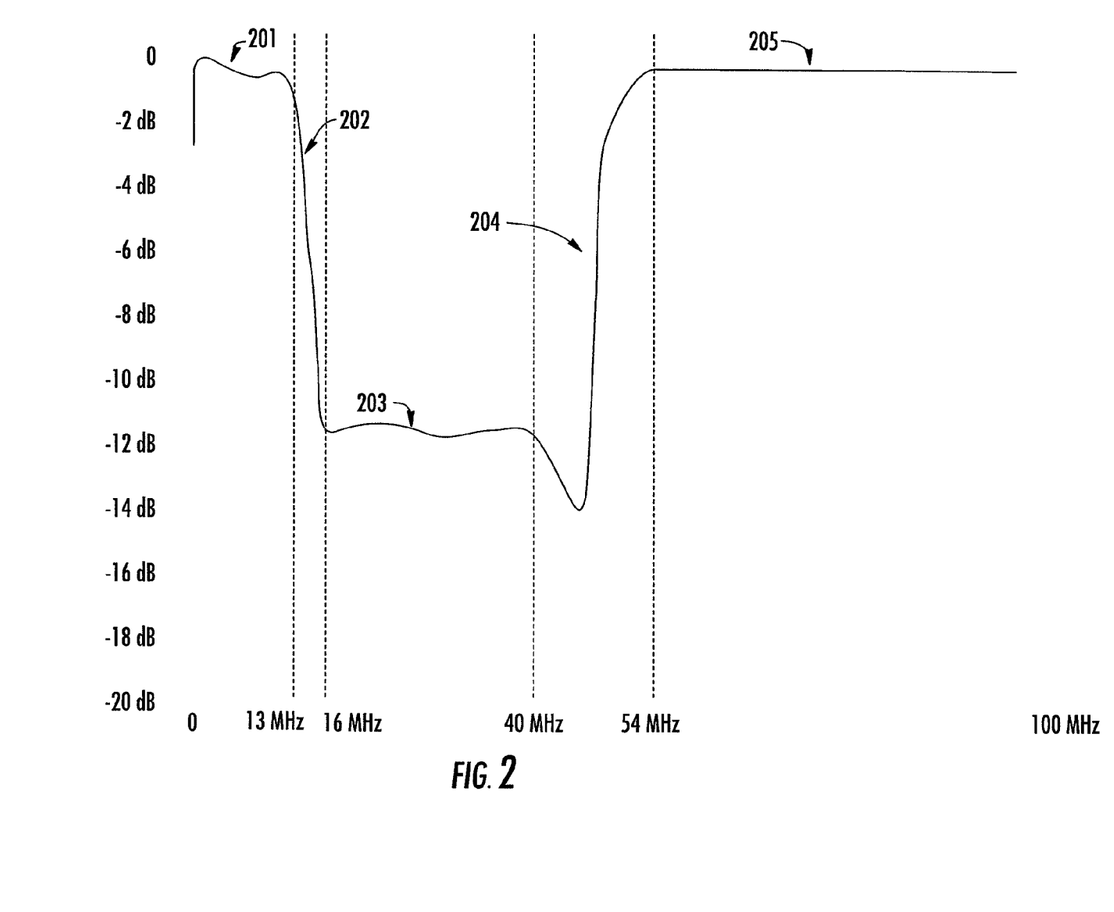
FIG. 2 is a diagram of the insertion loss of a filter circuit in accordance with one embodiment of the present invention, as a function of frequency.

FIG. 2 depicts a plot of insertion loss as a function of frequency in an embodiment of the low-pass step attenuator of the present invention. There is no attenuation in a low-pass portion 201 below a first frequency, shown as 13 MHz in FIG. 2. A first transition portion 202 exists between the first frequency and a second frequency, which is shown as 16 MHz. A flat loss portion of the bandwidth 203 shows flat attenuation of approximately 12 dB from the second frequency to a third frequency, which is shown as 40 MHz. A second transition portion 204 exists from the third frequency to a fourth frequency, which is shown as 54 MHz. There is no attenuation in the high-pass portion 205 above the fourth frequency.

It is noted that the frequencies provided herein are exemplary only and that the invention is no way limited to these exemplary frequencies. Via well known techniques of circuit design, including but not limited to adjustment of component values, it is possible to adjust any of the above frequency ranges as necessary to meet design needs. Attenuation values are similarly exemplary. By adjustment of component values, for example, the loss in the attenuating portion of the bandwidth may be increased or decreased. In the bidirectional CATV system application described above, low-pass step attenuators with a flat attenuation band of as little as 3 dB attenuation may be called for at taps far from the node return amplifier and low-pass step attenuators with a flat attenuation band of as much as 30 dB attenuation or even more may be called for at taps near the node return amplifier.

It is further noted that the intended meaning of the term flat is approximately flat and the intended meaning of the term uniform is approximately uniform. It is also noted that one of skill in the art will understand references to a lack of attenuation to include finite but relatively low amounts of attenuation. At least because of resistive properties of all circuit components, including the connections themselves, and because of the nature of filter design, it may not be possible to achieve zero attenuation. For example, a high-pass portion or low-pass portion may be defined as non-attenuating if the loss is of magnitude 3 dB, i.e. fifty percent, or less.

In a typical CATV application, the signals from the node may transmit on the forward path at frequencies above 50 MHz; a set top digital cable television receiver may transmit on the return path at frequencies near 10 MHz; and a cable modem may transmit on the return path at frequencies near 20 MHz. A prior art circuit with insertion loss response depicted in FIG. 1 above attenuates at 12 dB signals from the set top box and the cable modem. A circuit of the present invention with the insertion loss response depicted in FIG. 2 above attenuates at 12 dB signals from the cable modem but does not attenuate signals from the set top box.

Figure 3:
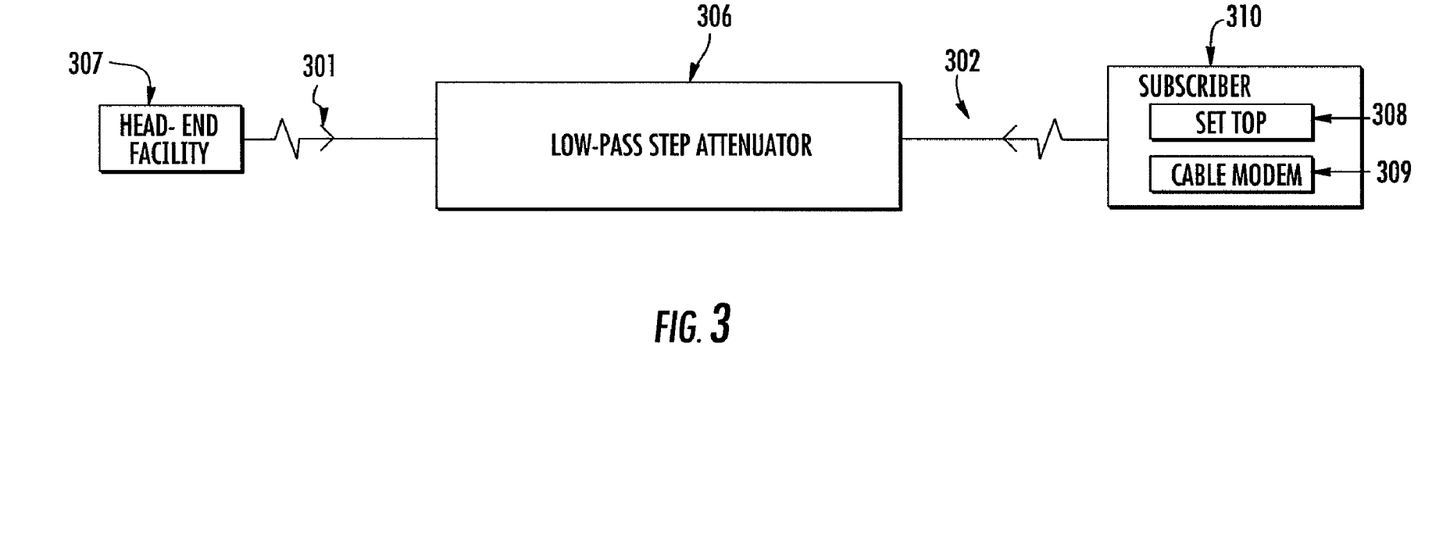
FIG. 3 is a block diagram of an embodiment of the present invention.

With reference to FIG. 3, a block diagram indicating the operation of one embodiment of the present invention is disclosed. The filter circuit of FIG. 3 has a first port 301 and a second port 302. For signals transmitted along the forward path, the first port serves as the input port and the second port serves as the output port. For signals transmitted along the reverse path, the second port serves as the input port and the first port serves as the output port. First port 301 is connected to a node in communication with head-end facility 307. Second port 302 is connected to a subscriber 310. In accordance with one embodiment of the present invention, the subscriber has both a set top box 308 and a cable modem 309. Between first and second ports 301 and 302 is a low pass step attenuator 306. This block passes forward path signals without attenuation, return path signals from the set top box without attenuation, and return path signals from the cable modem with uniform desired attenuation.

Figure 4:
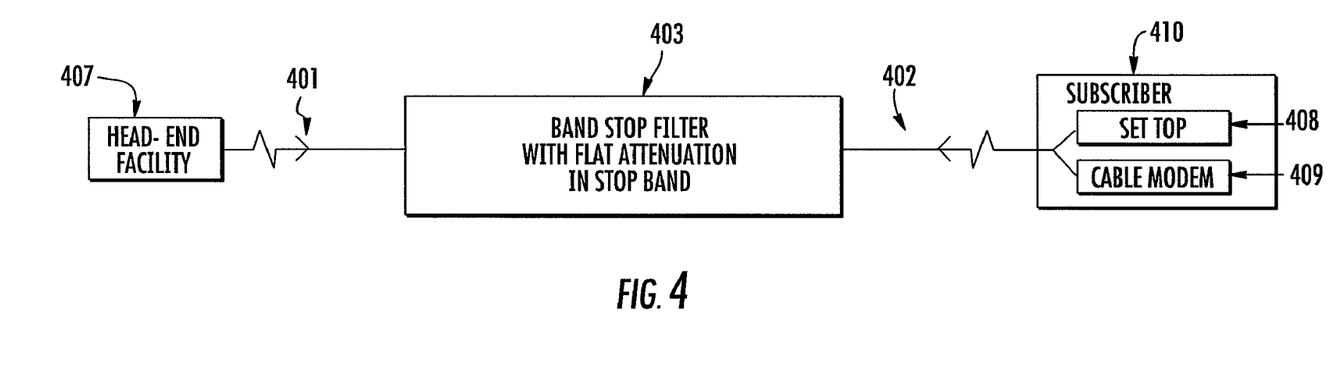
FIG. 4 is a block diagram of a second embodiment of the present invention.

FIG. 4 illustrates a second embodiment of the present invention. Like the previous embodiment, the circuit device of FIG. 4 includes first port 401 and second port 402. Between first and second ports 401 and 402 is a bandstop step attenuator using a bandstop filter 403. Bandstop filter 403 is characterized by a flat attenuation across the frequencies of interest. In the bidirectional CATV system discussed above, the forward path signals from the head end node pass the high-pass portion of the bandstop filter without attenuation, the return path signals from the set top box pass the low-pass portion of the bandstop filter without attenuation, and the return path signals from the cable modem pass with uniform desired attenuation in the stop band of the bandstop filter. The step attenuator with bandstop filter of FIG. 4 has an insertion loss of relatively little or no attenuation in a low-pass portion of the bandwidth, of uniform relatively higher attenuation in a flat loss portion, and of relatively little or no attenuation in a high-pass portion, as shown in FIG. 2.

Figure 5:
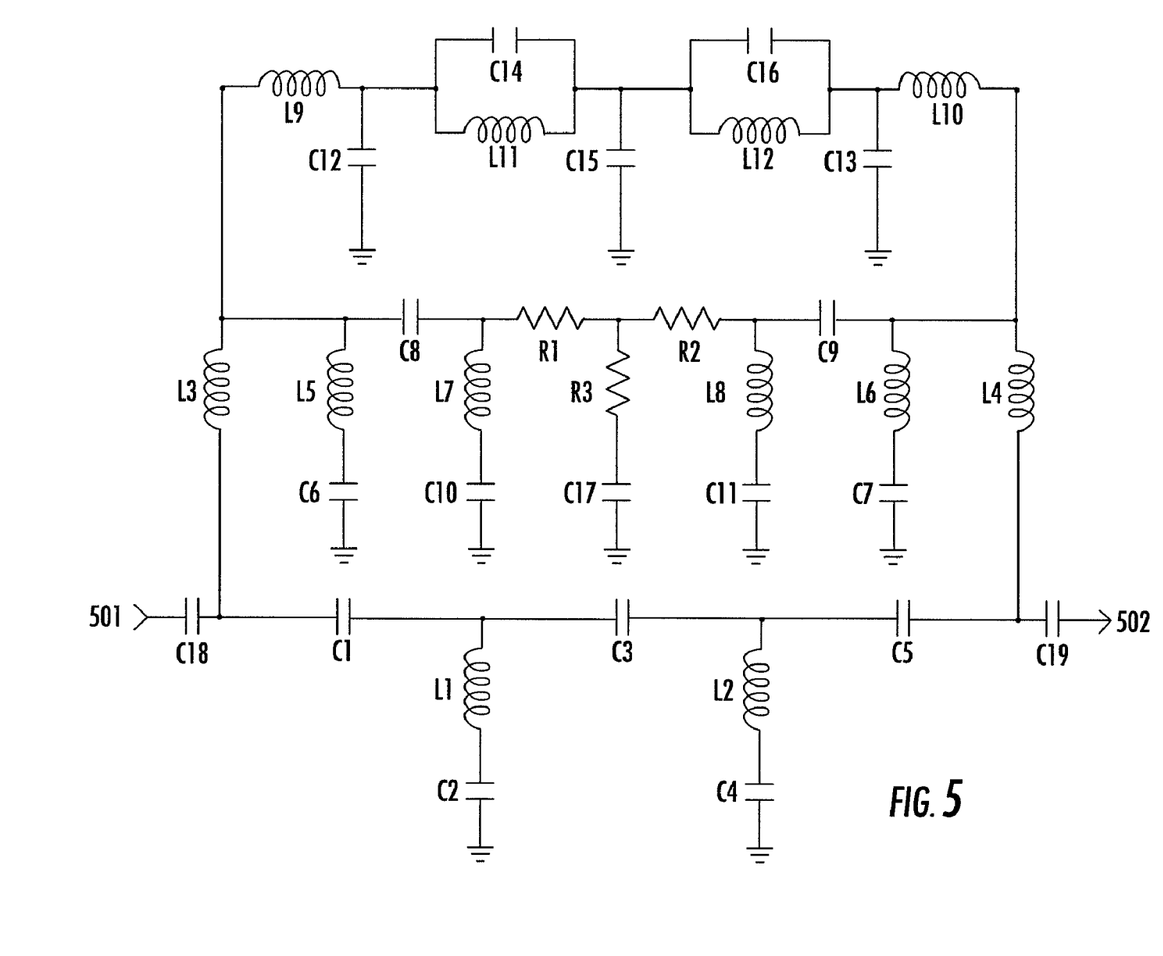
FIG. 5 is an electrical schematic of an embodiment of the present invention.

With reference to FIG. 5, a circuit diagram of an embodiment of the present invention is disclosed. The circuit is a modified triplex filter. Capacitor C18 and capacitor C19 are blocking capacitors. They are connected to first and second ports 501 and 502, respectively. Blocking capacitors C18 and C19 clip low frequency signals and protect the other filter components against power surges in the cable. Capacitors C1, C2, C3, C4, and C5 and inductors L1 and L2 form a filter path or branch that passes signals in the frequency range (e.g., 50 to 1000 MHz) of forward path communication. Capacitors C1, C3, and C5 are connected in series between blocking capacitors C18 and C19. Series connections of L1/C2 and L2/C4 connect the node between C1 and C3 and the node between C3 and C5 to ground, respectively. This filter is an operable embodiment, but other filter designs are operable with the present invention as well. An attenuating branch is formed by inductors L3, L4, L5, L6, L7, L8, capacitors C6, C7, C8, C9, C10, C11, C17, and resistors R1, R2, and R3. In this embodiment, the resistive network comprises three resistors R1, R2, and R3 arranged in a "T" format. Other resistive configurations suitable with the present invention include but are not limited to a three resistor "Π." Two resistor configurations such as an "L" and one resistor configuration are also operable. The resistive network is connected to ground through capacitor C17. The claimed invention could be constructed without any resistive components. Ferrite beads or other frequency dependent components could be used to provide attenuation in FIG. 5. The remaining components of the modified triplex filter form a branch which passes signals in the frequency range of the return path where no attenuation is required. Parallel LC arrangement L11/C14 and L12/C16 and capacitors C12, C13, and C15 collectively form an elliptic filter. Other filter designs, such as Butterworth or Chebyshev, are equally operable but may require additional components to implement.

Figure 6:
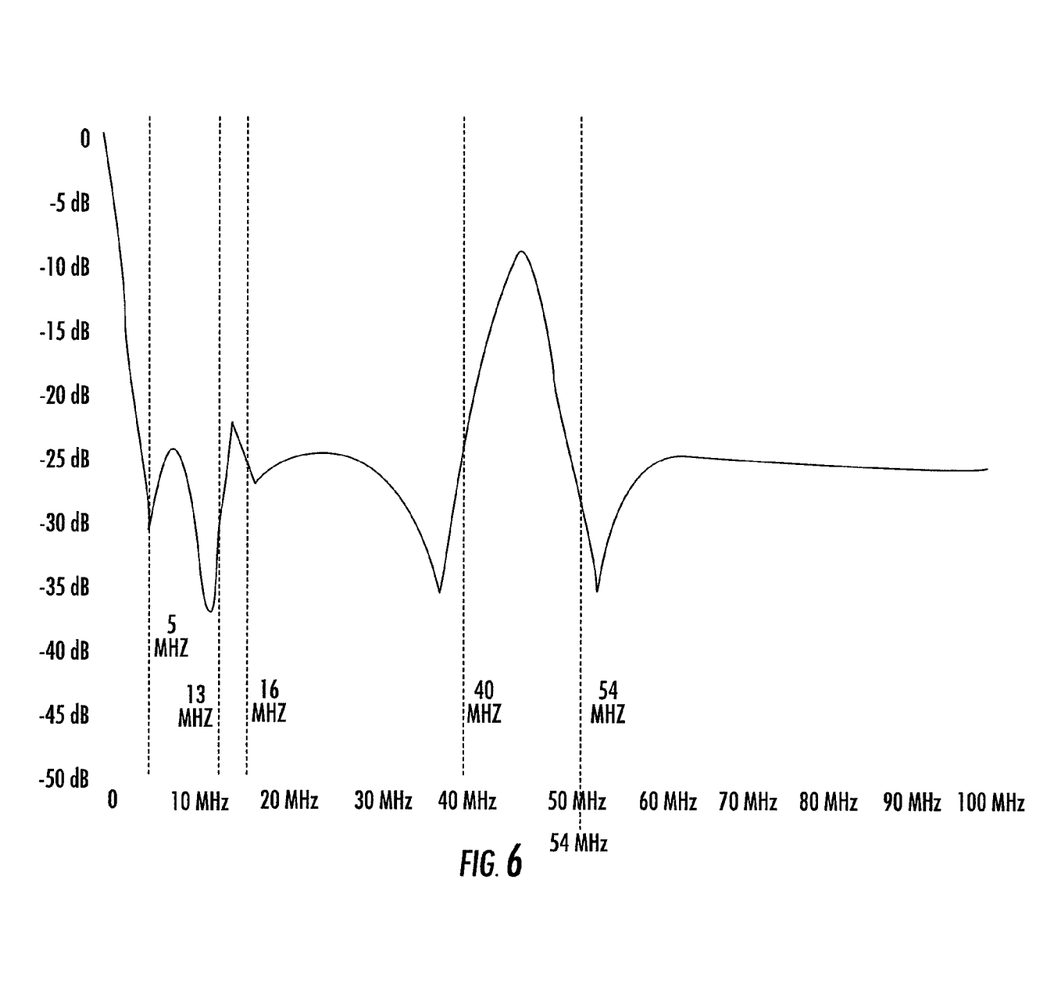
FIG. 6 is a diagram of the return loss of a filter circuit in accordance with one embodiment of the present invention, as a function of frequency.

Inductors L9 and L10 are useful for smoothing the frequency response transition from the low-pass range to the attenuated band pass range and for controlling return loss. The return loss is the amount of power reflected back to the input. It is generally desirable to minimize this return loss. The embodiment of FIG. 5 is designed to maintain a return loss with magnitude greater than 20 dB in all frequency regions for which signals of interest are transmitted. Return loss in the transition portions of the frequency response, in which no information is contained, may not be significant. FIG. 6 plots the return loss at first port 501 as a function of frequency. The return loss is greater than 20 dB for the low-pass portion from 5 MHz to 13 MHz, the flat loss portion from 16 MHz to 40 MHz, and the high-pass portion above 54 MHz. The return loss at second port 502 is similar. The schematic of FIG. 5 is approximately symmetric in either direction, although individual component values need not be symmetric. Symmetry is not necessary to the present invention, but has the advantage of symmetric return loss at port 501 and port 502 as a function of frequency.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A filter circuit having a frequency response, said frequency response comprising:
   a low-pass portion at a frequency range less than a first frequency; the low pass portion comprising a first branch that passes forward path signals between a first node and a second node;
   a blocking capacitor connected between the second node and an output terminal;
   a flat loss portion at a frequency range between a second frequency and a third frequency, the flat loss portion comprising a third branch providing attenuation for return path signals connected between the first node and the second node; and
   a high-pass portion at a frequency range higher than a fourth frequency, the high-pass portion comprising a second branch that passes return path signals with no attenuation connected between the first node and the second node;
   the flat loss portion providing greater attenuation that the low-pass and the high-pass portions;
   wherein the fourth frequency is higher than the third frequency, which is higher than the second frequency, which is higher than the first frequency.

2. The filter circuit of claim 1, wherein said first frequency is less than 16 MHz.

3. The filter circuit of claim 1, wherein said fourth frequency is greater than 50 MHz.

4. The filter circuit of claim 1, wherein said flat loss portion causes a uniform attenuation of less than 30 dB to frequencies between said second frequency and said third frequency.

5. The filter circuit of claim 1, wherein said flat loss portion causes a uniform predetermined attenuation.

6. The filter circuit of claim 1, wherein said filter circuit comprises a band stop filter.

7. The filter circuit of claim 1, wherein said filter circuit comprises a modified triplex filter having a branch that passes return path signals with no attenuation, a branch that provides attenuation in the return path, and another branch that passes forward path signals.

8. The filter circuit of claim 1, further comprising an input terminal and an output terminal, wherein the return loss at the input terminal is less than 20 dB in each of the low-pass portion, the high-pass portion, and the flat loss portion.

9. The filter circuit of claim 8, wherein the return loss at the input and the return loss at the output are symmetric in each of the low-pass portion, the high-pass portion, and the flat loss portion.

10. A bidirectional communications system having a forward path to a subscriber and a return path from a subscriber, forward path signals being transmitted along the forward path and return path signals being transmitted along the return path, further comprising:
    a filter circuit comprising a first branch that passes forward path signals between a first node and a second node with relatively little or no attenuation, a blocking capacitor connected between the second node and an output terminal, an attenuating branch that uniformly attenuates return path signals connected between the first node and the second node in a first frequency range, and a second branch that passes return path signals connected between the first node and the second node in a second frequency range with relatively little or no attenuation.

11. The filter circuit of claim 10, wherein said filter circuit has a frequency response, said frequency response comprising:
    a low-pass portion, of the first branch, at a frequency range less than a first frequency;
    a flat loss portion, of the attenuating branch, at a frequency range between a second frequency and a third frequency; and
    a high-pass portion, of the second branch, at a frequency range higher than a fourth frequency;
    wherein the fourth frequency is higher than the third frequency, which is higher than the second frequency, which is higher than the first frequency.

12. The filter circuit of claim 11, wherein said fourth frequency is lower than the frequency of said forward path signals.

13. The filter circuit of claim 12, wherein said third frequency is higher than the frequency of said return path signals.

14. The filter circuit of claim 13, wherein said second frequency is less than the frequency of return path signals from a first source of return path signals.

15. The filter circuit of claim 14, wherein said first source of return path signals is a cable modem.

16. The filter circuit of claim 14, wherein said first frequency is higher than the frequency of return path signals from a second source of return path signals.

17. The filter circuit of claim 16, wherein said second source of return path signals is a set top box.

18. A modified triplex filter comprising:
- means for passing signals, in a first branch between a first node and a second node, below a first frequency without attenuation;
- means for providing a block capacitance between the second node and an output terminal;
- means for applying uniform attenuation, in an attenuation branch between a first node and a second node, to frequencies between a second frequency and a third frequency; and
- means for passing signals, in a second branch between a first node and a second node, above a fourth frequency without attenuation.

19. A step attenuator for use in CATV applications with bidirectional communications having a forward path to a CATV subscriber and a return path from the CATV subscriber, the step attenuator including a circuit, in a first branch between a first node and a second node, that applies flat loss to frequencies below a first frequency on said return path and passes frequencies above a second frequency higher than said first frequency on said forward path, the step attenuator further comprising a second branch allowing signals from a CATV subscriber to pass without attenuation, the step attenuator further comprising a block capacitor connected between the second node and an output terminal.

20. The step attenuator of claim 19, wherein that branch passes without attenuation return path signals from a first source of return path signals.

21. The step attenuator of claim 19, where in the first source of return path signals is a set top box.

22. A circuit comprising a first branch, a second branch, and a third branch connected between a first node and a second node and a blocking capacitor connected between the second node and an output terminal, said first branch providing a no-attenuation path for signals lower than a first frequency; said second branch providing attenuation between a second frequency and a third frequency; and said third branch providing a no-attenuation path for signals higher than a fourth frequency.

23. The circuit of claim 22, wherein the first branch is an elliptic filter.

24. The circuit of claim 22, wherein the second branch includes a resistive network.

25. The circuit of claim 24, wherein said resistive network includes three resistors with a common node.

26. The circuit of claim 22, further comprising a first terminal, a second terminal, a first blocking capacitor connected to the first terminal, and a second blocking capacitor connected to the second terminal.

27. The circuit of claim 22, wherein the second branch includes ferrite beads.

28. A circuit for use in a two way communication system, comprising:
- an input terminal;
- an output terminal;
- a first capacitor connected between the input terminal and a first node;
- a first branch that passes forward path signals between the first node and a second node;
- a blocking capacitor connected between the second node and the output terminal;
- a second branch that passes return path signals with no attenuation connected between the first node and the second node; and
- a third branch providing attenuation for return path signals connected between the first node and the second node;
wherein the third branch includes a resistive network.

* * * * *

UNITED STATES PATENT AND TRADEMARK OFFICE
CERTIFICATE OF CORRECTION

PATENT NO.        : 8,150,004 B2                                        Page 1 of 1
APPLICATION NO.   : 11/616524
DATED             : April 3, 2012
INVENTOR(S)       : Palinkas et al.

It is certified that error appears in the above-identified patent and that said Letters Patent is hereby corrected as shown below:

Column 5, Claim 1, Line 59, attenuation delete "that" and insert -- than --

Signed and Sealed this
Twenty-ninth Day of May, 2012

David J. Kappos
*Director of the United States Patent and Trademark Office*